(12) United States Patent
Shibuya et al.

(10) Patent No.: US 8,896,380 B2
(45) Date of Patent: Nov. 25, 2014

(54) HIGH FREQUENCY AMPLIFIER

(71) Applicant: TDK Corporation, Ichikawa (JP)

(72) Inventors: Tomihiko Shibuya, Ichikawa (JP); Atsushi Ajioka, Ichikawa (JP); Atsushi Tsumita, Ichikawa (JP)

(73) Assignee: TDK Corporation, Tokyo (JP)

( * ) Notice: Subject to any disclaimer, the term of this patent is extended or adjusted under 35 U.S.C. 154(b) by 98 days.

(21) Appl. No.: 13/852,159

(22) Filed: Mar. 28, 2013

(65) Prior Publication Data

US 2013/0257540 A1  Oct. 3, 2013

(30) Foreign Application Priority Data

Mar. 28, 2012 (JP) ................................ 2012-074198

(51) Int. Cl.
*H03F 3/04* (2006.01)
*H03F 3/19* (2006.01)
*H01L 23/66* (2006.01)

(52) U.S. Cl.
CPC *H03F 3/19* (2013.01); *H01L 23/66* (2013.01); *H01L 2924/0002* (2013.01)
USPC .......................................... 330/289; 330/307

(58) Field of Classification Search
USPC ................. 330/289, 207 P, 307, 298
See application file for complete search history.

(56) References Cited

U.S. PATENT DOCUMENTS

| | | | | | |
|---|---|---|---|---|---|
| 3,418,592 | A | * | 12/1968 | Solomon et al. | 330/289 |
| 3,447,092 | A | * | 5/1969 | Hoke, Jr. | 330/289 |
| 4,209,754 | A | * | 6/1980 | Shiki et al. | 330/307 |
| 5,770,973 | A | * | 6/1998 | Fujisawa et al. | 330/289 |
| 6,344,775 | B1 | * | 2/2002 | Morizuka et al. | 330/288 |

FOREIGN PATENT DOCUMENTS

| | | |
|---|---|---|
| JP | 2007-306543 A | 11/2007 |
| JP | 2011-176592 A | 9/2011 |

* cited by examiner

*Primary Examiner* — Henry Choe
(74) *Attorney, Agent, or Firm* — Posz Law Group, PLC

(57) ABSTRACT

A high frequency amplifier is characterized wherein a power amplification element and at least one of temperature compensation elements are adjacently provided on a first semiconductor layer, a first wiring pattern connected to the power amplification element, a second wiring pattern connected to the temperature compensation element, and a ground electrode are provided on at least one of second semiconductor layers existing in layers different from the first semiconductor layer, and the ground electrode is formed on the second semiconductor layer corresponding to a region that substantially projects a crevice part on which the temperature compensation element and the power amplification element are provided, on the same plane as the first semiconductor element.

6 Claims, 7 Drawing Sheets

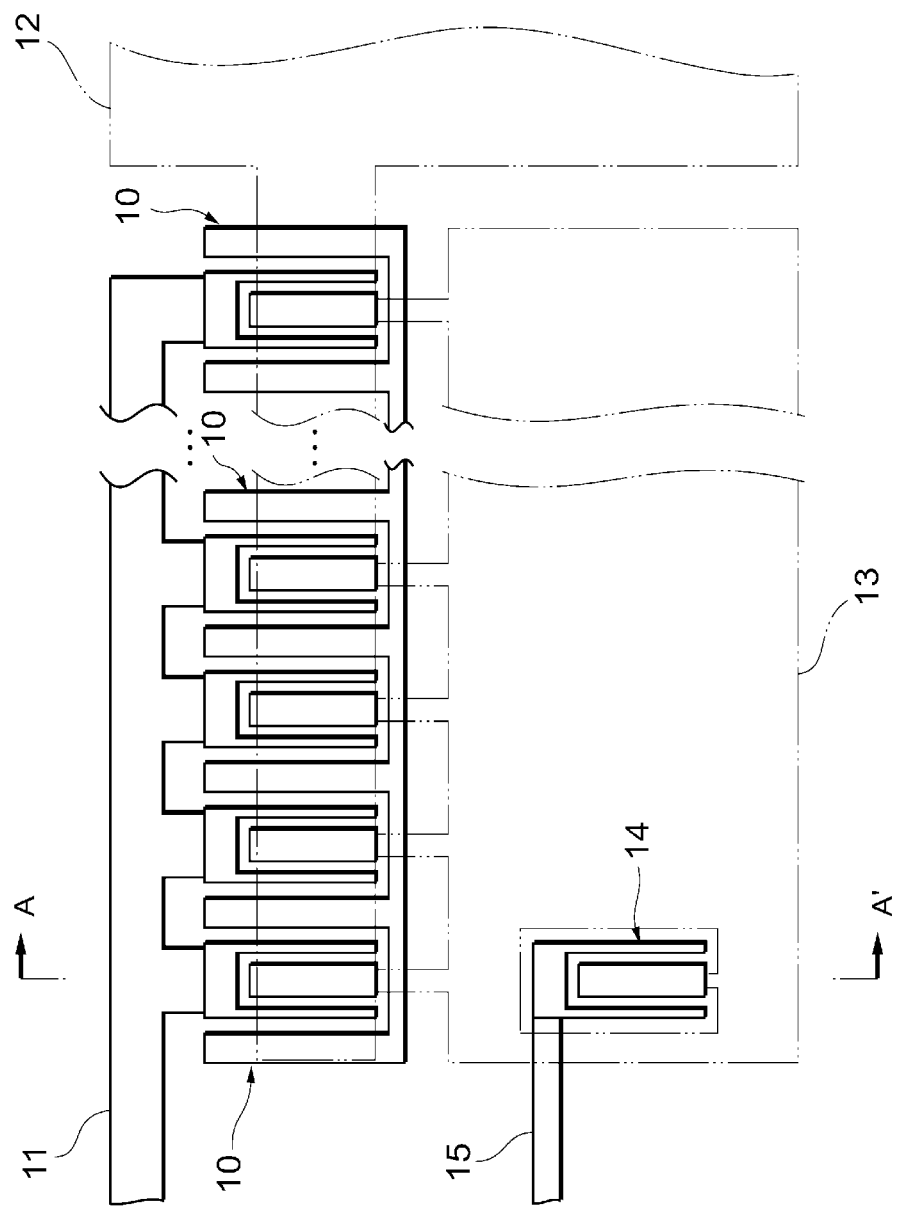

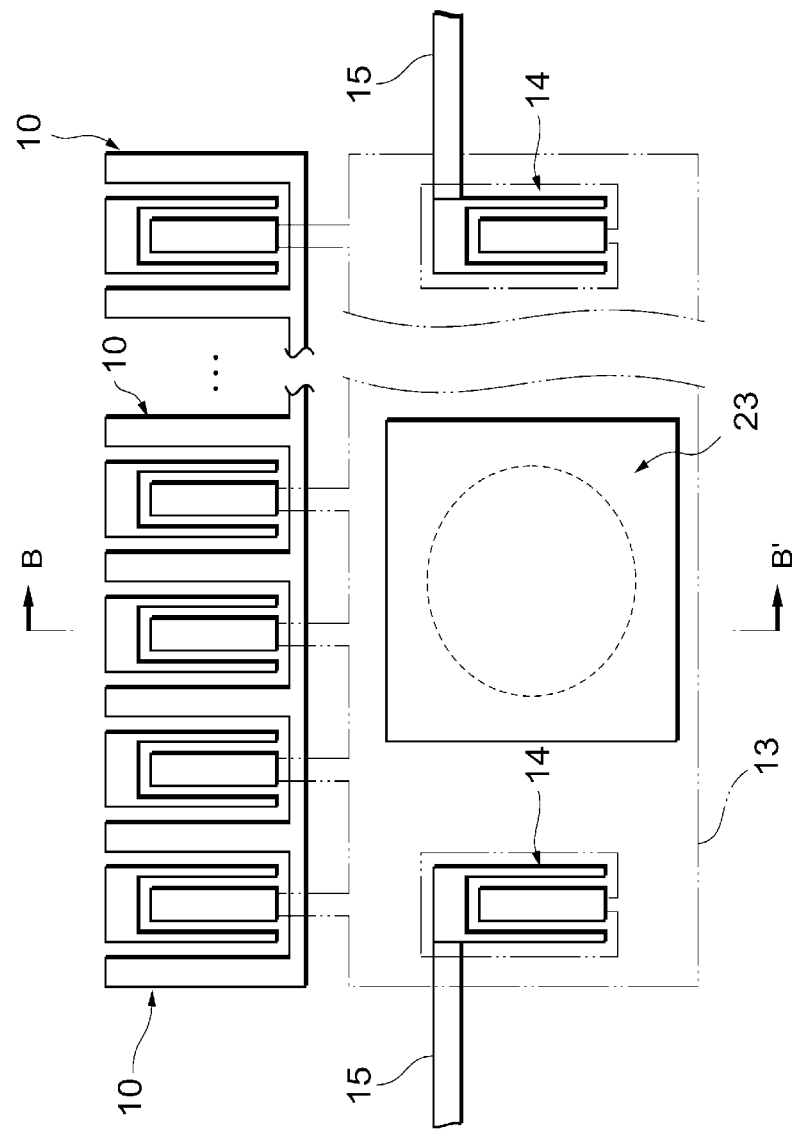

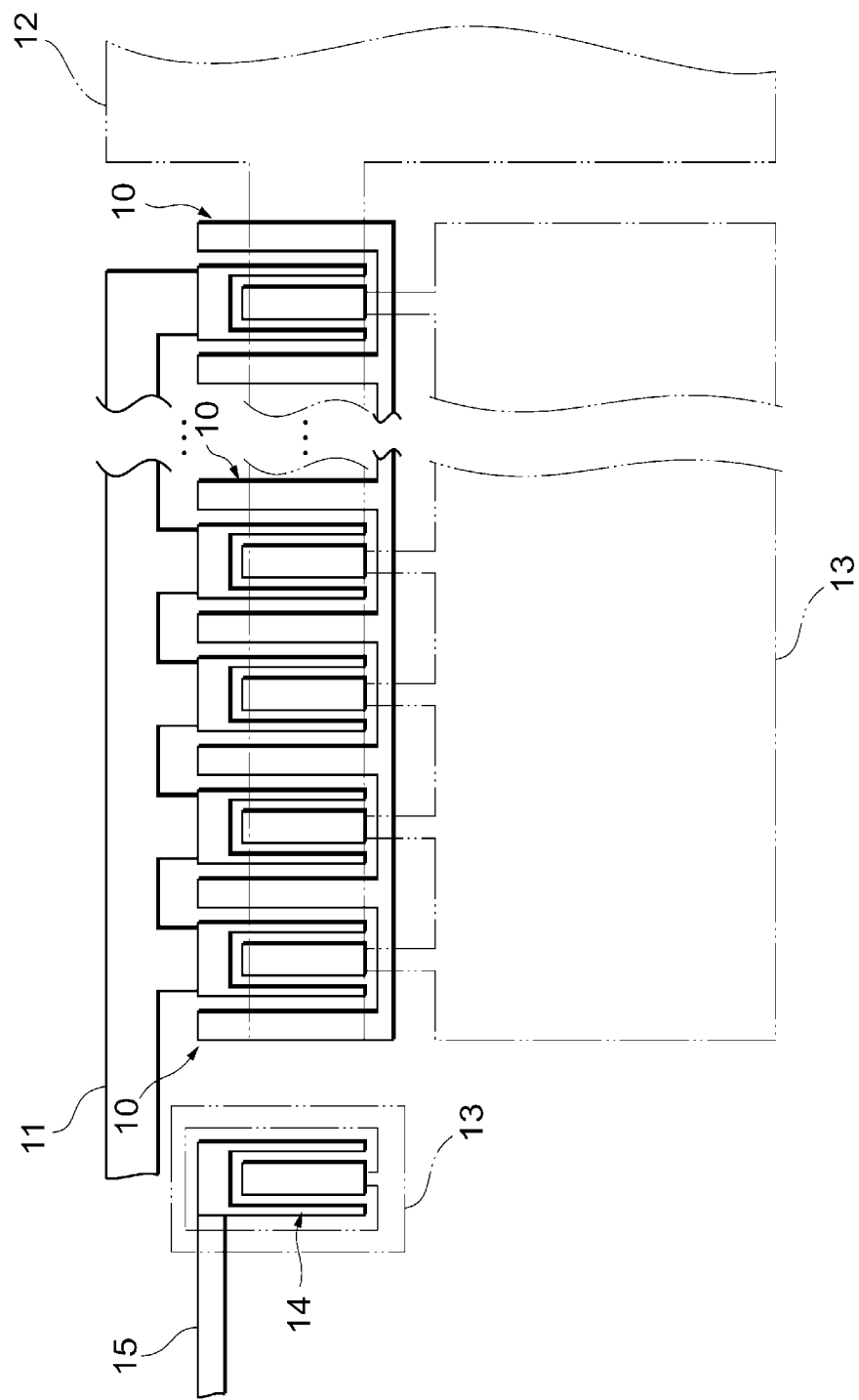

HIGH FREQUENCY AMPLIFIER

TECHNICAL FIELD

The present application relates to a high frequency power amplifier used for power amplification of high frequency signals.

BACKGROUND

In recent years, there has been a modulation system using a multi-carrier, which is represented by OFDM system such as WiMAX (for example, IEEE802.16-2004 and IEEE802.16e-2005) as a high speed wireless communication standard that covers communication distance of several kilometers, and long term evolution (LTE) as a standard for next generation mobile telephones. When the modulation system is used, waveforms become like waveforms of signals and noise, and a peak to ratio (PAR), which is a ratio of peak power and average power, becomes large.

In a modulation system such as QAM modulation, which changes both amplitudes and phases, the volume of information that can be transferred is increased due to multiple valuzation. However, because a margin with respect to noise is decreased, it needs to set a preferred carrier to noise ratio (CNR) larger. From such reasons, in a wireless communication device using the modulation system using the multi-carrier or QAM modulation system, a high frequency amplified in a transmission part should be designed to have a high linearity and large maximum transmission power. However, a high frequency amplifier that is designed to have high linearity and large maximum transmission power generally tends to have high power consumption. As a result of the high power consumption, temperature increase in the high frequency amplifier is remarkable. Generally, in the high frequency amplifier, a plurality of power amplification elements (transistors) is connected in a parallel and multistage manner; however, because the high frequency amplifier has a temperature characteristic that a current and voltage of the transistor changes in response to the temperature, temperature compensation of the transistors is an important issue to constantly maintain a gain of the high frequency amplifier with respect to the temperature change.

For example, there is a high frequency amplification circuit that includes: a power amplification element that amplifies high frequency signals; a bias circuit that supplies a bias current to an input of the power amplification element; a constant voltage source that outputs a constant voltage; a resistance whose one end is connected to the constant voltage source; and a temperature compensation diode whose anode is connected to the other end of the resistance, whose cathode is grounded, and which performs compensation of the temperature characteristic of the diode. Even when the temperature of the diode has changed when a voltage of an anode of the temperature compensation diode is supplied to an anode side of the diode, the diode is capable of suppressing the change of a current to be supplied to the input of the power amplification element. For example, JP Laid-Open Patent Application No. 2007-306543 is known as a document related to such type of temperature compensation technology.

Also, it is difficult to design a bias power source that has a temperature characteristic that a temperature change caused by a current flowing in a transistor completely offsets a temperature change caused by a bias current. Because a difference (or gap) in the temperature compensation occurs, it is difficult to constantly maintain a gain of the power amplifier and P1dB (1dB gain compression point) with respect to the temperature change. For example, JP Laid-Open Patent Application No. 2011-176592 is known as a document of a technology that compensates a difference in the temperature characteristic by including a power source circuit that has a temperature compensation function that supplies a current or a voltage to a circuit element so as to offset a temperature change caused by a current or a voltage of the circuit element, and a temperature characteristic compensation circuit that compensates a gap between the temperature characteristic of the power source circuit and the temperature characteristic of the circuit element.

However, there is a gap in an electrical characteristic with respect to the temperature change of the power amplifier between a result of circuit simulation and a result of actual measurement of the high frequency amplifier. That is because there is a temperature distribution in the high frequency amplifier, which is an actual semiconductor, and in other words, for instance, there is a temperature difference between the inside of a high frequency amplifier part that amplifies and outputs signals input to the high frequency amplifier and the inside of the bias circuit that supplies a bias current to the high frequency amplifier part. In a conventional technology, a temperature compensation element or a temperature compensation circuit is included in the bias circuit, and a different temperature is transferred due to time-dependent temperature change in the high frequency amplifier part or amount of signals, and therefore it has been difficult to design temperature compensation with excellent accuracy.

From these reasons, there has been a problem that it is difficult to constantly maintain a gain characteristic and prevent the deterioration of a P1dB (1 dB gain compression point) characteristic because it is difficult to supply a bias current that is appropriately temperature-compensated with respect to a periphery temperature change to the high frequency amplifier part. Also, in an arrangement where the temperature compensation element is arranged in the high frequency amplification part or a temperature compensation circuit is arranged nearby, it has not been easy to suppress irregular oscillation due to the effect of a higher harmonic wave because there is a coupling of a higher harmonic wave from the high frequency amplification part.

The present application is to resolve the above-described problems, and objectives of the present invention are to propose a high frequency amplifier that can realize accurate temperature compensation in response to a temperature change of a power amplification element.

SUMMARY

In order to achieve the above-described objectives, a high frequency amplifier disclosed in the application is characterized in which a power amplification element and at least one of temperature compensation elements are adjacently provided on a first semiconductor layer, a first wiring pattern connected to the power amplification element, a second wiring pattern connected to the temperature compensation element, and a ground electrode are provided on at least one of second semiconductor layers existing in layers different from the first semiconductor layer, and at least one of the ground electrodes is formed on the second semiconductor layer corresponding to a region that substantially projects a crevice part on which the temperature compensation element and the power amplification element are provided, on the same plane as the first semiconductor element.

According to the present application having the above-described feature, the ground element between the first wiring pattern connected to the power amplification element on the first semiconductor layer and the second wiring pattern connected to the temperature compensation element on the first semiconductor layer is formed in a portion of the second semiconductor layer that almost projects the crevice part between the temperature compensation element and the power amplification element in the plane the same as the first semiconductor layer. This makes it possible to adjacently position the power amplification element and the temperature compensation element. As a result, temperature of the power amplification element in the high frequency amplifier is accurately transferred to the temperature compensation element with respect to the temperature change due to the chronological temperature change and the temperature change due to the amount of signals. Therefore, it becomes possible to maintain a gain characteristic during the temperature change of the power amplification element and prevent the deterioration of P1dB characteristic.

The high frequency amplifier having the above-described feature of the present application has a second feature in which the high frequency amplifier has the second semiconductor layers provided above and under the first semiconductor layer.

According to the present application having the above-described feature, the second semiconductor layers are provided above and under the first semiconductor layer, and a ground electrode layer is provided with respect to a coupling by a higher harmonic wave from the power amplification element in the high frequency amplifier to the temperature compensation element in the high frequency amplifier. Therefore, it is possible to remove isolation and to suppress irregular oscillation due to the effect of the higher harmonic wave.

The high frequency amplifier having the above-described feature of the present application has a third feature that the ground electrode is formed in a region that projects over a crevice part on which the temperature compensation element and the power amplification element.

According to the present application having the above-described feature, the ground electrode is formed in a region that projects over the crevice part on which the temperature compensation element and the power amplification element are provided. Therefore, it is possible to prevent noise from the external of the high frequency amplifier and to prevent the increase of a current of the power amplification element affected by the external noise.

The high frequency amplifier having the above-described feature of the present application has a fourth feature that the power amplification element is a plurality of the power amplification elements, and the plurality of the power amplification elements is connected in a parallel and multistage manner.

According to the present application having the above-described feature, the power amplification elements are connected in the parallel and multistage manner. When the temperature of each stage of the high frequency amplification parts varies, temperature compensation suitable for each high frequency amplifier is performed. Thereby, an excessive current consumption in the high frequency amplifier on each stage during the temperature change of the power amplification element is prevented and thermal runaway is prevented. Also, the shortage of bias current supply is prevented, and the deterioration of the electric characteristic due to the shortage of the bias current supply can be prevented.

The high frequency amplifier of the present application includes at least one or more temperature compensation elements in the high frequency amplifier. Therefore, the temperature compensation element in the high frequency amplifier accurately compensates the temperature of the inside of the high frequency amplifier, and it is possible to prevent the deterioration of an electrical characteristic of the high frequency amplifier during the temperature change of the inside of the high frequency amplifier.

BRIEF DESCRIPTION OF DRAWINGS

FIG. 2A is an example of a layout diagram of an inside of a high frequency amplification part according to the first embodiment.

FIG. 5A is an example of a layout diagram of an inside of a high frequency amplification part according to a second embodiment.

FIG. 6 is an example of a layout diagram of an inside of a high frequency amplification part according to a third embodiment.

DETAIL DESCRIPTION OF THE EMBODIMENTS

Hereinafter, embodiments of the present application are explained with reference to the drawings.

First Embodiment

Figure 1:
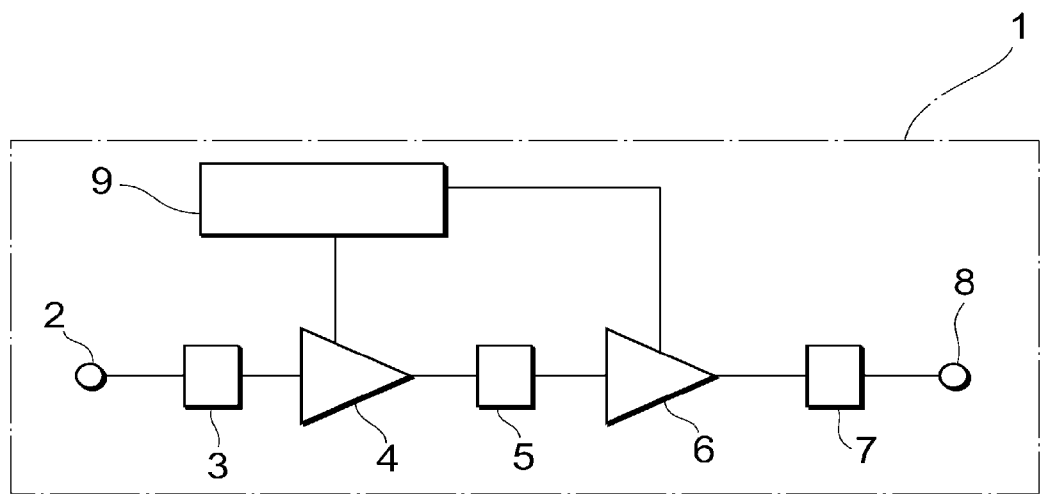
FIG. 1 is an example of a block circuit diagram of a high frequency amplifier according to a first embodiment.

FIG. 1 is a block diagram that shows an entire configuration of a general high frequency amplifier according to a first embodiment. FIG. 1 is a general configuration example of a high frequency amplifier that is assembled in a parallel and two-stage manner. In a high frequency amplifier 1 of FIG. 1, high frequency signals are: input from an input terminal 2; are transferred via a matching circuit 3; amplified at a first high frequency amplification part 4; transferred via a matching circuit 5; amplified at a second high frequency amplification part 6 to even larger output power; and transferred via a matching circuit 7, and the amplified high frequency signals are output from an output terminal 8. A constant bias current is supplied from the bias circuit 9 to the first high frequency amplification part 4 and the second high frequency amplification part 6 respectively. Usually, power is supplied from an external supply power source to the bias circuit 9, but a description thereof is omitted in the present embodiment. A configuration of the bias circuit 9 may be, for example, a current mirror that is capable of supplying a constant current. In the present application, the general configuration example that is the high frequency amplifier assembled in a parallel and two-stage manner is used to make the description simpler; however, other configuration examples than that of the present embodiment may be applicable. A block configuration of a high frequency amplifier other than FIG. 1 may be applicable.

FIG. 2A is a top plan view of a part of a layout example of the first high frequency amplification part 4 and the second high frequency amplification part 6. High frequency signals are input from an input terminal 11 and the amplified high frequency signals are output from an output terminal 12, and terminals of power amplification elements 10 that are not connected to the input terminal 11 and the output terminal 12 are connected to a ground electrode 13. Also, at least one temperature compensation element 14 exists in a region where the ground electrode 13 is, and the temperature compensation element 14 is connected to a wiring 15 and the ground electrode 13 that are connected to the temperature compensation element 14.

Figure 2B:
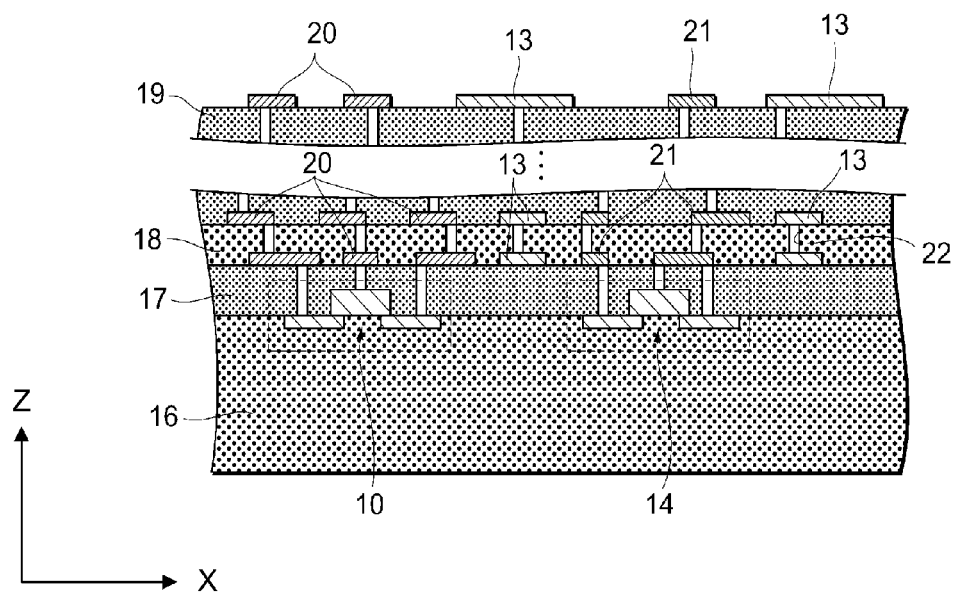
FIG. 2B is a vertical sectional view cut along the A-A' line of FIG. 2A that shows the inside of the high frequency amplification part according to the first embodiment.

FIG. 2B is a sectional view cut along the A-A' line of FIG. 2A and shows one example of a layer configuration in the high frequency amplifier according to the present application. In FIG. 2B, on a first semiconductor layer 16, the power amplification element 10 and the at least one temperature compensation element 14 are adjacently provided. On a second semiconductor layer 17, a third semiconductor layer 18, and a fourth semiconductor layer 19, which are provided above the first semiconductor layer 16, first wiring patterns 20 connected to the power amplification element 10, second wiring patterns 21 connected to the temperature compensation element 14, ground electrodes 13, and the like are provided. Also, at least one of the ground electrodes 13 provided on the second semiconductor layer 17 through the fourth semiconductor layer 19 is formed corresponding to a region that substantially projects a crevice part that is between the temperature compensation element 14 and the power amplification element 10, which is on the same plane as the first semiconductor layer 16. In other words, one of the ground electrodes 13 provided on the second semiconductor layer 17 through the fourth semiconductor layer 19 is arranged between the temperature compensation element 14 and the power amplification element 10 from a view of the lamination direction (or Z direction) in FIG. 2B. Only at least one layer out of the second semiconductor layer 17 through the fourth semiconductor layer 19 needs to exist, and also in a region that projects both the power amplification element 10 and the temperature compensation element 14, the second semiconductor layer 17 through the fourth semiconductor layer 19 are provided. Also, in a region that projects over a crevice part on which the power amplification element 10 and the temperature compensation element 14 are provided, the ground electrodes 13 are formed.

The high frequency amplification part described herein is a configuration part that is applied to both the first high frequency amplification part 4 and the second high frequency amplification part 6 of FIG. 1. The first wiring patterns 20, the second wiring patterns 21, and patterns of the ground electrodes 13 on the second semiconductor layer 17 through the fourth semiconductor layer 19 are formed of a conductor, or the like, and are connected by vias 22. The first wiring pattern 20 is, for example, the input terminal 11 and the output terminal 12 of FIG. 2A, and the second wiring pattern 21 is, for example, the wiring 15 connected to the temperature compensation element 14 of FIG. 2A. Depending on a circuit configuration, the first wiring pattern 20 and the second wiring pattern 21 may be connected with each other.

The first high frequency amplification part 4 and the second high frequency amplification part 6 have the same layout configuration, and a big difference between the first high frequency amplification part 4 and the second high frequency amplification part 6 is that the number of transistors, which are the power amplification elements 10, is different. Generally, the number of transistors, which are the power amplification elements 10, varies depending on the specification and configuration of the high frequency amplifier 1. From this reason, in the present embodiment, the number of transistors, which are the power amplification elements 10, is not specified.

Generally, power of high frequency signals in the high frequency amplification part 6 that is a subsequent part is larger than that of the high frequency amplification part 4 that is a preceding part, and therefore, in the high frequency amplification part 6, the number of the power amplification elements 10 is larger and the configuration has a larger layout size. When the number of the power amplification elements is large, the amount of a current flowing in the high frequency amplification part becomes large, and it is more likely to self-heat. Furthermore, the high frequency amplification part 6 that is the subsequent part is more likely to heat than the high frequency amplification part 4 that is the preceding part does. Therefore, when the high frequency amplification parts are connected in a parallel and multistage manner, a configuration in which the above-described configuration part is applied to only the high frequency amplification part 6 that is the subsequent part 6 may be applicable. Also, in the present embodiment, the power amplification elements 10 are explained as transistors. However, bipolar transistors (HBT), field effect transistors, and the like may also be applicable.

Figure 3:
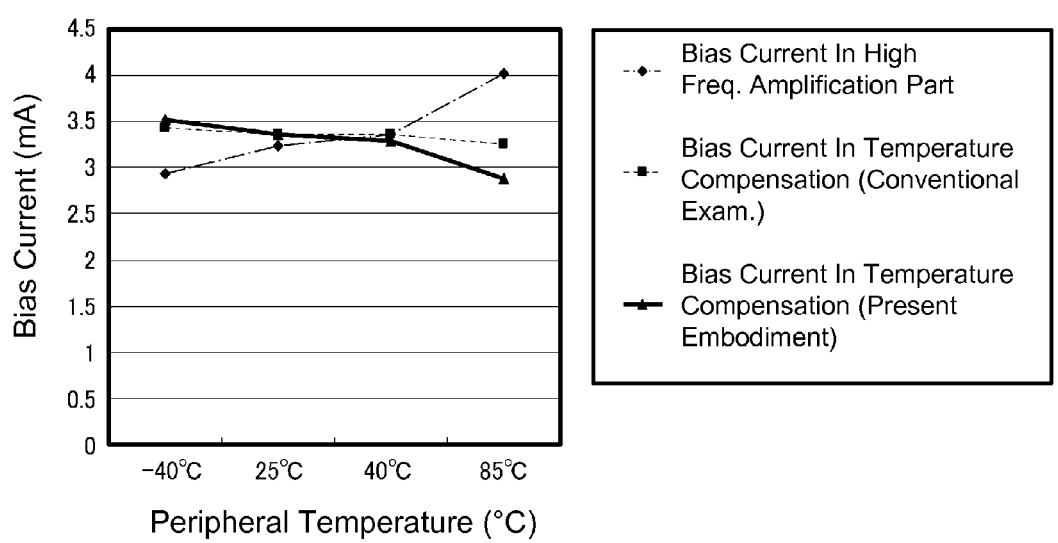
FIG. 3 is a graph of the bias current value of the high frequency amplifier according to the first embodiment.
Figure 4:
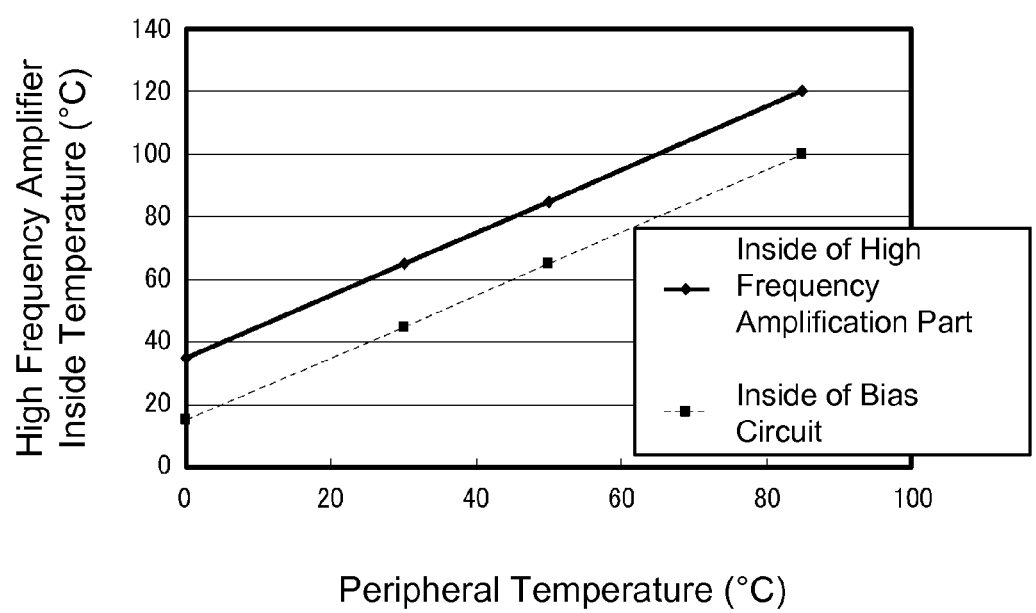
FIG. 4 is a temperature distribution graph of the inside of the high frequency amplifier according to the first embodiment.

FIG. 3 is a transitive graph of the bias current with respect to the temperature change of the high frequency amplifier. FIG. 4 is the comparison of the temperature transitions of the inside of the second high frequency amplification part 6 and the inside of the bias circuit 9 during the temperature change of the high frequency amplifier. FIG. 4 shows that the temperature difference between the inside of the second high frequency amplification part 6 and the inside of the bias circuit 9 is approximately 20° C. This is because there is a variation in the temperature distribution even on the same semiconductor substrate because the heat amount of the high frequency amplification part and the heat amount of the inside of the bias circuit 9 are different. In a case where the temperature compensation element 14 is disposed in the bias circuit 9 as the conventional example, the temperature difference occurs between the inside of the bias circuit 9 and the inside of the high frequency amplification part as in FIG. 4 even when the bias current in the power amplification elements 10 changes depending on the temperature change in the power amplification elements. Therefore, the constant bias current from the bias circuit 9 is distributed to the temperature compensation element 14 and the power amplification elements 10. As a result, unless the proper function as the temperature compensation is performed, a bias current necessary for the high frequency amplification part becomes excessively short. Therefore, the power characteristic of the high frequency amplifier 1 changes due to the effect of temperature change of the power amplification elements. For example, the gain characteristic may not be constant, and the P1dB characteristic, etc. may be deteriorated.

However, in the present embodiment, because the temperature compensation element 14 and the power amplification elements 10 are adjacently arranged, the temperatures of the inside of the high frequency amplification part and the temperature compensation element 14 are the same and the temperature deference does not occur. In order that the temperature compensation element 14 properly functions as the temperature compensation, even when a bias current necessary for the power amplification elements 10 increases or decreases depending on the temperature of the power amplification elements 10, the temperature compensation element 14 has a reversal characteristic of the bias current to the power amplification elements 10, as illustrated in FIG. 3, following the temperature change of the power amplification elements 10, and it becomes possible to supply the bias current necessary for the high frequency amplification part due to the effect of the temperature change of the power amplification elements 10. Therefore, for example, the gain characteristic, which is an electric characteristic of the high frequency amplifier 1, is constant not depending on the temperature of the power amplification elements 10, and the deterioration of the P1dB characteristic is prevented. The temperature compensation element 14 described herein may be an element that connects a base terminal and a collector terminal when for example the transistors, which are the power amplification elements 10, are HBT. The temperature compensation element 14 may not be the HBT.

In other words, in the present embodiment, on the first semiconductor layer 16, the power amplification elements 10 and the at least one temperature compensation element 14 are adjacently arranged. At least on the second semiconductor layer 17 existing in a different layer from the first semiconductor layer 16, the firs wiring patterns 20 connected to the power amplification elements 10, the second wiring patterns 21 connected to the temperature compensation element 14, and the ground electrodes 13 are arranged. At least one of the ground electrodes 13 arranged on the second semiconductor layer 17 is formed on a portion of the second semiconductor layer 17 corresponding to a region that substantially projects the crevice part on which the locations of the temperature compensation element 14 and the power amplification elements 10 are provided, which is on the same plane as the first semiconductor layer 15. Therefore, the temperature of the inside of the high frequency amplification part is transferred to the temperature compensation element 14 in the high frequency amplification part accurately with respect to the chronological temperature change and the temperature change due to the amount of signals. As a result, it becomes possible to supply a bias current that is accurately temperature-compensated with respect to the power amplification elements 10, the gain characteristic of the power amplification elements 10 during the temperature change is maintained constant, and the deterioration of the P1dB characteristic can be prevented.

Also, the accuracy of the bias current supply becomes better due to the temperature compensation. Therefore, when a plurality of the temperature compensation elements 14 exist, the number of the plurality of the temperature compensation elements 14 may be smaller than the number of the temperature compensation elements 14 arranged in the bias circuit 9 in a prior art, and it is possible to make the size compact by decreasing the number of the plurality of the temperature compensation elements 14.

Also, according to the present embodiment, the second semiconductor layer 17 is arranged in a region that projects both the power amplification elements 10 and the temperature compensation element 14. Therefore, it is possible to remove isolation and suppress the wraparound of the higher harmonic wave component from the power amplification elements 10, and as a result irregular oscillation is less likely to occur even when the temperature compensation element 14 is arranged.

Also, according to the present embodiment, the ground electrode 13 is formed in a region that projects over the crevice part on which the temperature compensation element 14 and the power amplification elements 10 are provided. Therefore, noise from the external of the high frequency amplifier 1 can be prevented, and the increase in a current in the power amplification elements 10 that is affected by the external noise can be prevented.

Also, according to the present embodiment, the high frequency amplifier 1 is connected in a parallel and multistage manner as the first high frequency amplification part 4 and the second high frequency amplification part 6, and the temperature compensation element 14 is in the high frequency amplification part in each stage. Therefore, the temperature compensation suitable for the high frequency amplification part on each stage is performed, and thereby an excessive current consumption in the high frequency amplification part on each stage during the temperature change of the power amplification elements 10 is prevented and thermal runaway is prevented. Also, the shortage of bias current supply is prevented, and the deterioration of the electric characteristic due to the shortage of the bias current supply can be prevented.

Second Embodiment

Figure 5B:
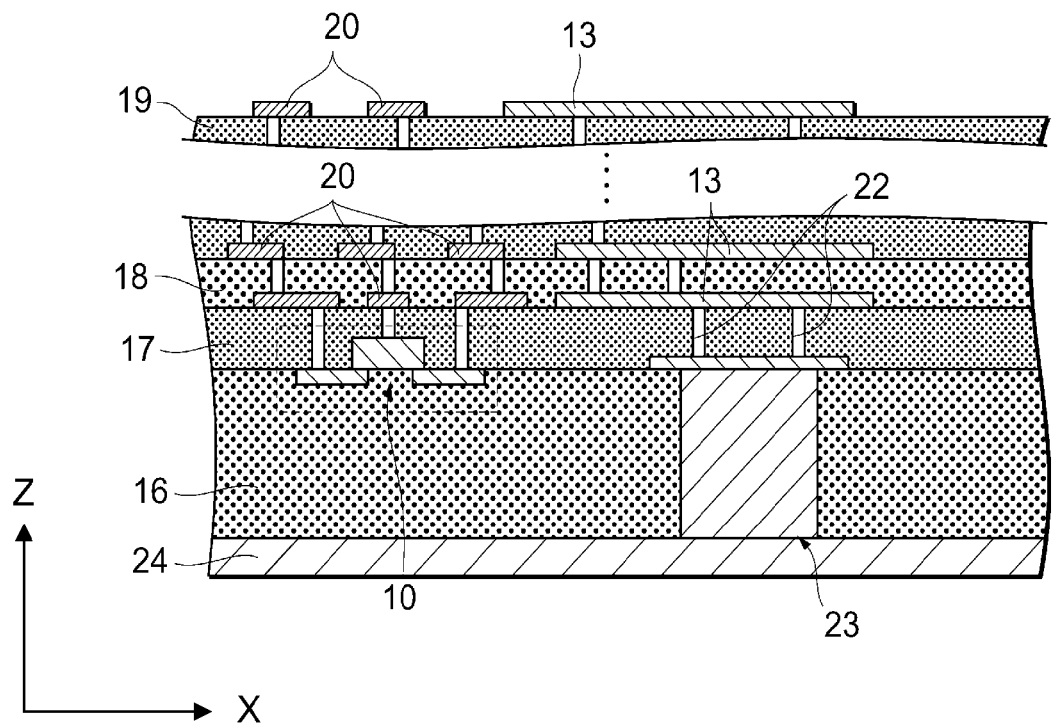
FIG. 5B is a vertical sectional view cut along the B-B' line of FIG. 5A that shows the inside of the high frequency amplification part according to the second embodiment.

FIG. 5A is a top view that shows a layout configuration example of a high frequency amplification part according to a second embodiment of the present application. FIG. 5B is a sectional view cut along line B-B' of FIG. 5A. In the present embodiment, only portions having a different configuration from the above-described first embodiment are explained. Specifically, a via hole 23 is provided in a ground electrode region of the ground electrode 13 connected to the power amplification elements 10 in the high frequency amplification part, and at least one of the temperature compensation element 14 exists thereround in the region of the ground electrode 13. The via hole 23 is formed through the first semiconductor layer 16, and the via hole 23 is connected to ground the electrode layers 13, the vias 22, and a conductor layer 24 formed as the ground electrode 13 on an opposite surface of the first semiconductor layer 16. Also, as far as the via hole 23 functions the same as the via hole 23, the via hole 23 may not be through the first semiconductor layer 16.

According to the present embodiment, the via hole 23 is connected to the ground electrode 13 in the high frequency amplification part, and at least one of the temperature compensation element 14 is disposed around the via hole 23. As a result, isolation of the ground electrode 13 in a portion on the second semiconductor layer 17 that is projected by both the power amplification elements 10 and the temperature compensation element 14 is improved, and thereby it becomes possible to suppress oscillation due to the wraparound of the higher harmonic wave component even when the higher harmonic wave with large power exists, and as a result irregular oscillation is suppressed even when the output of the high frequency amplifier is high.

Third Embodiment

FIG. 6 is a top view of a layout configuration example of a high frequency amplification part according to a third embodiment of the present application. In the present embodiment, only portions having a different configuration from the above-described first embodiment and the second embodiment are explained. Specifically, the power amplification elements 10, the first wiring patterns 20 where at least one of the temperature compensation element 14 is provided nearby and that is connected to the power amplification elements 10, the input terminal 11 and the output terminal 12 in the high frequency amplification part, the second wiring pattern 21 that is the temperature compensation element 14 and the wiring 15 connected to the temperature compensation element 14, and the ground electrode 13 are provided. The temperature compensation element 14 doesn't exist in the region of the ground electrode 13 connected to the power amplification elements 10.

According to the present embodiment, the ground electrode 13 is provided in a region that is projected by both the temperature compensation element 14 and the power amplification elements 10, and the temperature compensation element 14 and the power amplification elements 10 are adjacently arranged. Therefore, isolation of the power amplification elements 10 and the temperature compensation element 14 is removed, and the temperature of the power amplification elements 10 is more likely to transfer to the temperature compensation element 14. For example, the present embodiment is usable for a case where an amplifier with a low output power is used so that the temperature thereof doesn't reach such a high temperature and the accuracy in the case of the first and second embodiments is not necessary. Because a layout arrangement change of the region of the ground electrode 13 in the high frequency amplification part is unnecessary by adding the temperature compensation element 14, it is possible to perform layout arrangement easily and shorten the design time. The ground electrode 13 connected to the power amplification elements 10 and the ground electrode 13 connected to the temperature compensation element 14 may be either separated or connected. Also, the layout may change due to a process structure of a semiconductor and the configuration of the high frequency amplifier, another layout configuration different from that of the present embodiment may also be applicable.

As described above, the invention that has been invented by the inventors of the present application was explained based on the embodiments. However, the present invention is not limited to the above-described embodiments, and also it is needless to say that it is possible to variously vary the present invention within a range that doesn't deviate from the scope of the present invention.

As described above, the high frequency amplifier of the present application is usable to a device (such as a mobile telephone machine), and the like, using an amplification element that performs transmission and receipt of high frequency signals. Especially, it is suitable for a case when the small variation of an electrical characteristic even when the temperature change of the power amplification element occurs over a large range of output power and a stable performance should be realized.

What is claimed is:

1. A high frequency amplifier being characterized wherein
a power amplification element and at least one of temperature compensation elements are adjacently provided on a first semiconductor layer,
a first wiring pattern connected to the power amplification element, a second wiring pattern connected to the temperature compensation element, and a ground electrode are provided on at least one of second semiconductor layers existing in layers different from the first semiconductor layer, and
the ground electrode is formed on the second semiconductor layer corresponding to a region that substantially projects a crevice part on which the temperature compensation element and the power amplification element are provided, on the same plane as the first semiconductor element.

2. The high frequency amplifier according to claim 1, wherein
the second semiconductor layers are provided above and under the first semiconductor layer in a lamination direction.

3. The high frequency amplifier according to claim 2, wherein
the ground electrode is a plurality of the ground electrodes, and
the ground electrodes are formed in a region that projects over the crevice part on which the temperature compensation element and the power amplification element.

4. The high frequency amplifier according to claim 3, wherein
the power amplification element is a plurality of the power amplification elements, and
the plurality of the power amplification elements is connected in a parallel and multistage manner.

5. A high frequency amplifier, comprising:
a power amplification element;
a temperature compensation element;
a first wiring pattern connected to the power amplification element;
a second wiring pattern connected to the temperature compensation element;
a ground electrode;
a first semiconductor layer; and
second semiconductor layers existing above the first semiconductor layer in a lamination direction, wherein
the power amplification element and the temperature compensation element are adjacently provided on the first semiconductor layer,
the first wiring pattern, the second wiring pattern, and the ground electrode are provided on one of the second semiconductor layers, and
the ground electrode provided on the one of the second semiconductor layers is arranged between the temperature compensation element and the power amplification element that are provided on the first semiconductor layer in a view from the lamination direction.

6. The high frequency amplifier according to claim 5, wherein
each of the second semiconductor layers includes the first wiring pattern, the second wiring pattern, and the ground electrode, and
the ground electrodes are respectively arranged between the temperature compensation element and the power amplification element on the first semiconductor layer in the view from the lamination direction.

* * * * *